(12) United States Patent
Yao et al.

(10) Patent No.: US 7,605,529 B2
(45) Date of Patent: Oct. 20, 2009

(54) FIELD EMISSION DEVICE AND METHOD OF MAKING SUCH

(75) Inventors: Yuan Yao, Beijing (CN); Jie Tang, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 535 days.

(21) Appl. No.: 11/309,930

(22) Filed: Oct. 30, 2006

(65) Prior Publication Data

US 2007/0296320 A1 Dec. 27, 2007

(30) Foreign Application Priority Data

Jun. 23, 2006 (CN) .......................... 200610061304

(51) Int. Cl.
*H01J 1/62* (2006.01)
*H01J 1/304* (2006.01)
*H01J 63/04* (2006.01)

(52) U.S. Cl. ...................................... 313/495; 313/496

(58) Field of Classification Search ......... 313/495–497, 313/309, 310
See application file for complete search history.

(56) References Cited

U.S. PATENT DOCUMENTS 5,729,094 A * 3/1998 Geis et al. ................. 315/169.1
6,825,608 B2 11/2004 Chen
7,081,030 B2 7/2006 Liu et al.

OTHER PUBLICATIONS

"Advances of Carbon Nanotube Field Emission Display", Zhu Chang-Chun and Liu Xing-Hui, Chinese Journal of Lumnescence, vol. 26, p. 557-563 (2005).

* cited by examiner

*Primary Examiner*—Nimeshkumar D. Patel
*Assistant Examiner*—Anthony T Perry
(74) *Attorney, Agent, or Firm*—D. Austin Bonderer

(57) ABSTRACT

A field emission device includes a transparent anode substrate, an anode, a cathode substrate, a cathode, and a fluorescent layer. The anode is formed on the anode substrate. The cathode is formed on the cathode substrate. The cathode faces toward the anode and is spaced therefrom at a predetermined distance. The fluorescent layer is formed on the cathode and faces toward the anode. A method for manufacturing the field emission device is also disclosed.

15 Claims, 6 Drawing Sheets

FIELD EMISSION DEVICE AND METHOD OF MAKING SUCH

TECHNICAL FIELD

The present invention relates to display devices and, more particularly, to a field emission device (FED) and a method for manufacturing the FED.

BACKGROUND

In recent years, display devices have been developed and widely used in electronic applications such as personal computers, mobile phones, or personal digital assistants. At present, popular choices for display devices include liquid crystal display devices (LCDs), plasma display panels (PDPs), and FEDs. The FEDs have higher contrast ratios, wider viewing angles, higher maximum brightness, lower power consumption, shorter response time, and broader operating temperature ranges when compared to conventional LCDs and PDPs.

The FEDs operate based on emission of electrons in a vacuum and the subsequent impingement of those electrons on a fluorescent layer to emit light, thereby producing a desired image. The electrons are generally emitted from micron-sized or nanometer-sized tips (i.e., electron emitters) in a strong electric field. The electrons are accelerated and then collide with the fluorescent material, thereby emitting the light. The FEDs are thin and lightweight and capable of providing high brightness.

FIG. 5 illustrates a typical FED 40. The FED 40 includes a cathode substrate 41, a cathode 42 disposed on the cathode substrate 41, a transparent anode substrate 45, an anode 44 disposed on the anode substrate 45, and a fluorescent layer 46 formed on the anode 44. The anode 44 is distanced from the cathode 42 via a vacuum interspace 49. The cathode 42 includes a conductive base 47 and a plurality of electron emitters 48 formed thereon. The fluorescent layer 46 includes a plurality of fluorescent units 460.

However, on the one hand, when manufacturing the FED 40, different colored fluorescent powders are coated on selective portions of the anode 44 to form numerous fluorescent units 460, thereby obtaining the fluorescent layer 46. Each fluorescent unit 460 of the fluorescent layer 46 needs to be accurately aligned with each electron emitter 48 of the cathode 42, according to a predetermined alignment approach, to obtain a desired image. Nevertheless, during manufacturing, alignment errors are often incident between the fluorescent units 460 and the electron emitters 48, thus producing image distortion of the FED 40.

On the other hand, referring to FIG. 6, the FED 40 generates a transformation when distorted or folded. In this distorted form, the two substrates 41, 45, the cathode 42, the anode 44, and the fluorescent layer 46 can also generate respective alterations. Due to the interspace 49, after transformation, the electron emitters 48 and the fluorescent layer 46 are misaligned or displaced with respect to each other, accordingly producing an image aberration.

What is needed, therefore, is an FED that can have a relatively accurate and stable alignment between a fluorescent layer and a cathode, even if the FED should become bent or distorted.

What is needed, also, is a method for manufacturing the desired FED.

SUMMARY

In accordance with a preferred embodiment, a field emission device includes a transparent anode substrate, an anode, a cathode substrate, a cathode, and a fluorescent layer. The anode is formed on the anode substrate. The cathode is formed on the cathode substrate. The cathode faces toward the anode and is spaced therefrom at a predetermined distance. The fluorescent layer is formed directly on the cathode and faces toward the anode.

A method for manufacturing the field emission device includes the steps of:

providing a cathode substrate;

forming a cathode on the cathode substrate;

forming a fluorescent layer directly on the cathode;

providing a transparent anode substrate;

forming an anode on the anode substrate, the anode facing toward the fluorescent layer; and assembling the anode substrate to the cathode substrate at a predetermined distance, thereby obtaining the field emission device.

Other advantages and novel features will be drawn from the following detailed description of preferred embodiments when conjunction with the attached drawings.

BRIEF DESCRIPTION OF THE DRAWINGS

Many aspects of the present FED and method of making such can be better understood with reference to the following drawings. The components in the drawings are not necessarily drawn to scale, the emphasis instead being placed upon clearly illustrating the principles of the present FED and its method of manufacture. Moreover, in the drawings, like reference numerals designate corresponding parts throughout the several views.

DETAILED DESCRIPTION OF THE PREFERRED EMBODIMENTS

Embodiments of the present FED and method will now be described in detail below and with reference to the drawings.

Figure 1:
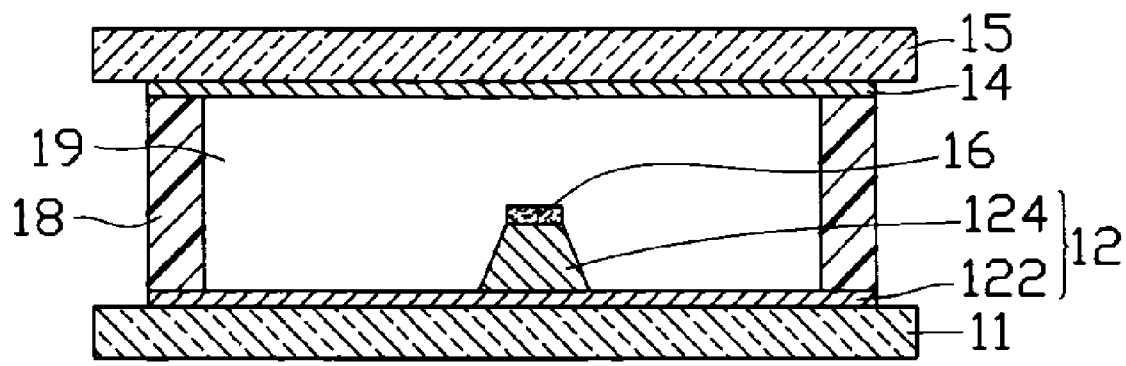
FIG. 1 is a schematic, cross-sectional view of an FED, according to a first preferred embodiment.

FIG. 1 illustrates an FED 10, in accordance with a first preferred embodiment. The FED 10 includes a cathode substrate 11, a cathode 12, an anode 14, a transparent anode substrate 15, and a fluorescent layer 16. The cathode 12 is formed on the cathode substrate 11. The anode 14 is formed on the anode substrate 15. The fluorescent layer 14 is formed directly on the cathode 12.

The cathode substrate 11 can be, e.g., a flat panel. The cathode substrate 11 can, usefully, be made of a non-conductive material, for example, glass, ceramic, or plastic. The non-conductive material can further be engineered to be transformable/flexible, such as by material choice, for example, a flexible/pliable glass, ceramic, composite, or plastic, or by element thickness.

The cathode 12 includes a base 122 and an electron emitter 124 formed thereon and in electrical contact therewith. Each electron emitter 124 generally extends away from the cathode 12 and toward the anode 14. Advantageously, each electron emitter 124 is essentially formed/attached directly on the base 122. (Such essentially direct formation/attachment encompasses any needed adhesive layer or catalyst layer, i.e., any intermediate layer that is for attachment/formation purposes and not primarily for another function.) The base 122 is, beneficially, an electronically conductive film or metal layer. The base 122 is made of, for example, indium tin oxide (ITO) or another conductive material. Alternatively, the base 122 can be made of a flexible, electronically conductive material or of a flexible material doped with an electronically conductive material. The electron emitter 124 is made of a material having a high emissive capacity, for example, carbon nanotubes, carbon fibers, graphite, diamond, silicon carbide, silicon, or an emissive metal (e.g., niobium (Nb) and molybdenum (Mo)). The electron emitter 124 can be in form of, e.g., a column, cone, pyramid, or a frustum of cone. In this illustrated embodiment, the electron emitter 124 includes bundles of carbon nanotubes.

Alternatively, the cathode substrate 11 can be made of an electrically conductive material, for example, copper (Cu), silver (Ag), gold (Au), nickel (Ni), molybdenum (Mo), tungsten (W), or an alloy thereof. The conductive material can be a malleable/pliable metal or an alloy-doped transformable/flexible material. In this situation, the cathode 12 includes at least one electron emitter 124 formed on the electrically conductive cathode substrate 11.

The anode 14 is in the form of a conductive film or a metal layer and is made of, beneficially, indium tin oxide (ITO) or another conductive, transparent/translucent material, in order to permit light transmission therethrough. Alternatively, the anode 14 can be made of a flexible conductive material or a pliable material doped with a conductive material. The anode 14 faces toward the cathode 12 and is spaced from the cathode 12. A plurality of sidewalls 18 is interposed between the cathode 12 and the anode 14, thereby delimiting/defining an interspace 19. The interspace 19 can be a vacuum-sealed space, in order to promote optimal electron emission.

The transparent anode substrate 15 is advantageously made of a transparent non-conductive material, for example, glass or silicon dioxide. The transparent material can be a pliable material or a composite material doped with a transformable/flexible material, for example, fiberglass or silicon dioxide doped with a flexible material. The anode substrate 15 can be, e.g., a flat panel.

The fluorescent layer 16 is made of a fluorescent material, e.g., a phosphor. The fluorescent material generates visible light after being bombarded with the electrons. The fluorescent layer 16 is advantageously integrally and/or directly formed on the tip (i.e., distal end) of a given electron emitter 124 and faces toward the anode 14. Accordingly, electrons emitted from the electron emitter 124 are directly incident into/upon the fluorescent layer 16 without passing through the interspace 19. The fluorescent layer 16 thus is excited to generate a complex energy level transition and then emits visible light, thus helping to generate a desired image, when considering the combined effect of multiple fluorescent layers 16.

A manufacturing method for the FED 10 includes the following steps:

providing a cathode substrate 11;

forming a cathode 12 on the cathode substrate 11;

forming a fluorescent layer 16 directly on the cathode 12 (i.e., in contact therewith);

providing a transparent anode substrate 15;

forming an anode 14 on the transparent anode substrate 15; and assembling the anode substrate 15 to the cathode substrate 11 at a predetermined distance therefrom, thereby obtaining the FED 10.

The formation of the cathode 12 advantageously includes the steps of: forming an electrically conductive base 122 on the cathode substrate 11, when employing a non-conductive substrate material; and forming an electron emitter 124 on the electrically conductive base 122. The base 122 and the electron emitter 124 can be formed by a method, for example, a chemical vapor deposition method, a coating method, a sputtering method, a photoresist process, a screen print process, or a combination thereof (e.g., the base 122 and the electron emitter 124 need not both be formed by the same method). In this illustrated embodiment, the electron emitter 124 could be made of carbon nanotubes. The carbon nanotubes could beneficially be grown on the electrically conductive base 122, e.g., by a chemical vapor deposition method. In the example of carbon nanotubes, a catalyst layer comprised of transition metal (e.g., iron, cobalt, and nickel) could be preformed on the electrically conductive base 122, e.g., by an evaporation deposition method. The carbon nanotubes would then be grown on the catalyst layer.

The fluorescent layer 16 is formed on at least the tip of a given electron emitter 124 of the cathode 12. The formation method of the fluorescent layer 16 could be, e.g., a chemical vapor deposition method, a coating method, a sputtering method, a photoresist process, or a screen print process. For example, a phosphor powder slurry could be coated on the electron emitter 124, thus forming the fluorescent layer 16. Accordingly, in this construction, the fluorescent layer 16 is constantly aligned with respect to the cathode 12, i.e., the electron emitter 124, thereby ensuring the quality of image. It is to be understood that the formation/attachment of the fluorescent layer 16, directly (as shown) or even via an intermediate layer, to the electron emitter 124 provides for the close proximity and the consistent positioning of the fluorescent layer 16 relative to the corresponding cathode 12.

Alternatively, the cathode substrate 11 could be an electrically conductive substrate. In this situation, the formation of the cathode 12 could include the step of: forming an electron emitter 124 on the electrically conductive cathode substrate 11. For example, a layer of carbon nanotubes could be grown on the electrically conductive cathode substrate 11 by a chemical vapor deposition method, thereby obtaining the electron emitter 124.

The anode 14 can also be formed on the anode substrate 15 by a method, for example, a chemical vapor deposition method, a coating method, a sputtering method, a photoresist process, or a screen print process. The anode substrate 15 could, in turn, be assembled to the cathode substrate 11 by the support of the sidewalls 18. The anode substrate 15 would, accordingly, be spaced from the cathode substrate 14 by the sidewalls 18, resulting in an interspace 19 therebetween. The interspace 19 can be evacuated to a suitable vacuum level and isolated/sealed from the outside environment.

In particular, the steps for manufacturing the FED 10 could be rearranged relative to the order set above, so long as the desired FED 10 results. For example, the provision of anode substrate 15 and the formation of the anode 14 on the anode substrate 15 could be performed prior to the provision of the cathode substrate 11.

Figure 2:
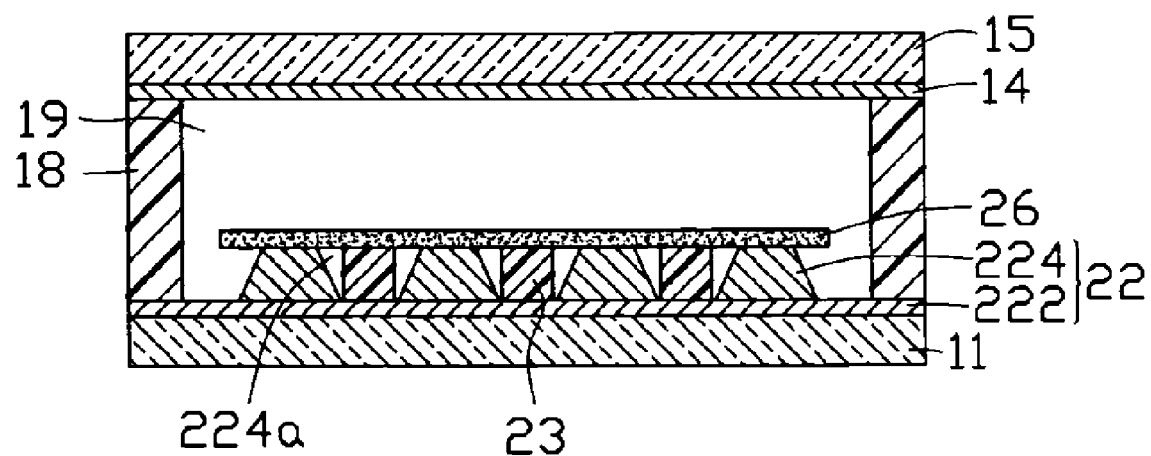
FIG. 2 is a schematic, cross-sectional view of an alternative FED, according to a second preferred embodiment.

FIG. 2 illustrates an alternative FED 20, in accordance with a second embodiment. The FED 20 is essentially similar to the FED 10, except with respect to the cathode 22 and the fluorescent layer 26. The cathode 22 includes an electrically conductive base 222 and a plurality of electron emitters 224 arranged/formed thereon.

The electrically conductive base 222 is essentially similar to the electrically conductive base 122 of the FED 10. Each of the plurality of electron emitters 224 is essentially similar to the electron emitter 124 of the FED 10. The plurality of electron emitters 224 could advantageously be arranged on the electrically conductive base 222 in form of, e.g., matrix, alignment, or array. For example, the plurality of electron emitters 224 are an array of aligned carbon nanotubes.

The fluorescent layer 26 is, as per the second embodiment, advantageously a continuous integral layer formed on the plurality of electron emitters 224. The fluorescent layer 26 effectively includes a plurality of fluorescent portions (not labeled), each such portion being formed on and in contact with one respective electron emitter 224. The plurality of electron emitters 224 defines, laterally, a plurality of clearances 224a therebetween. As show in FIG. 2, the fluorescent layer 26 bridges such clearances 224a, due to its continuity.

Preferably, a plurality of non-conductive barriers 23 extend, advantageously, from the base 222 to the fluorescent layer 26, within the clearances 224a to isolate adjacent electron emitters 224. The non-conductive barriers 23 can be made of an insulating material, for example, glass, plastic, Bakelite, or a non-conductive polymer. Each non-conductive barrier 23 can have a height essentially similar to a height of any adjacent electron emitter 224. Accordingly, portions of the continuous fluorescent layer 26 are supported on the non-conductive barriers 23, not just upon the electron emitters 224.

Similarly to the FED 10, in the FED 20, electrons emitted from the electron emitters 224 can also be directly incident into the fluorescent layer 26 without passing through the interspace 19. The fluorescent units of the fluorescent layer 26 thus are excited to generate complex energy level transitions and then emit various kinds (e.g., intensity and/or color) of visible light, thus yielding a desired image.

The manufacturing method for the FED 20 is essentially similar to the manufacturing method for the FED 10, except with respect to the formation of the cathode 22 and the fluorescent layer 26.

The formation of the cathode 22 includes the steps of: forming an electrically conductive base 222 on the non-conductive cathode substrate 11; and forming a plurality of electron emitters 224 on the electrically conductive base 222. The cathode base 222 and the electron emitters 224 can also be formed by, for example, a chemical vapor deposition method, a coating method, a sputtering method, a photoresist process, or a screen print process. Alternatively, a plurality of electron emitters 224 could be formed on the electrically conductive cathode substrate 11, thereby obtaining the cathode 22.

Taking a photoresist process as an example, a photoresist layer could be preformed on the conductive base 222 and then be exposed and developed to form a predetermined patterned layer, e.g., an array pattern or a matrix pattern, via a photomask. An array or matrix layer of carbon nanotubes could be grown on patterned regions of the conductive base 222, accordingly producing the desired electron emitters 224.

The formation of the fluorescent layer 26 can include the steps of: forming the desired fluorescent layer 26 on a supporting film 15; attaching the fluorescent layer 26 to the plurality of electron emitters 224; and removing the supporting film, thereby exposing the fluorescent layer 26 on the electron emitters 224. The supporting film 15 is comprised of a polymer, e.g., polyester. During the forming process, corresponding portions of the fluorescent layer 26 inherently are aligned with respective electron emitters 224.

Figure 3:
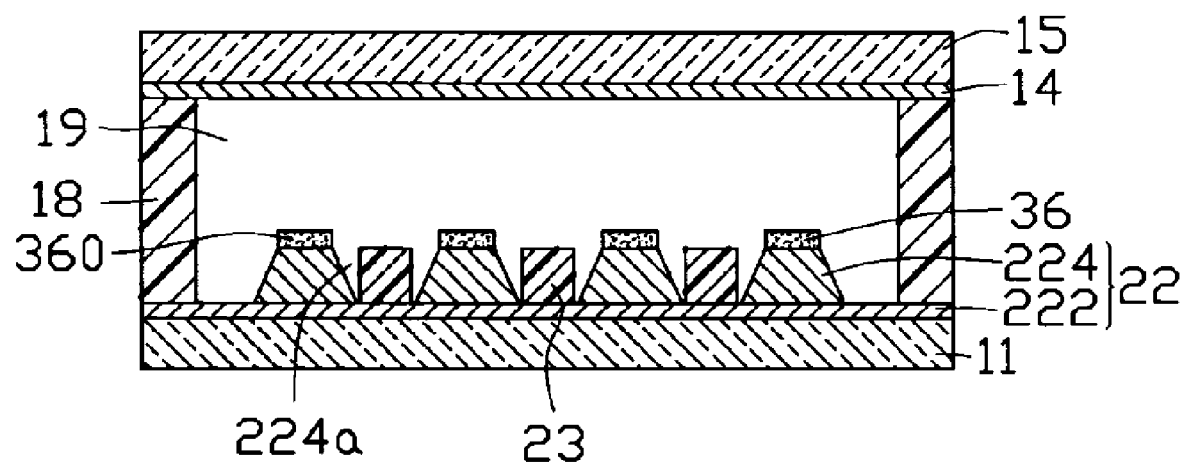
FIG. 3 is a schematic, cross-sectional view of another alternative FED, according to a third preferred embodiment.

FIG. 3 illustrates another alternative FED 30, in accordance with a third embodiment. The FED 30 is essentially similar to the FED 20, except with respect to the fluorescent layer 36.

In the illustrated embodiment, the fluorescent layer 36 is a discontinuous layer (i.e., discrete portions) formed on the plurality of electron emitters 224. The fluorescent layer 36 includes a plurality of fluorescent units 360. Each fluorescent unit 360 is formed on one respective electron emitter 224. Accordingly, electrons emitted from each electron emitter 224 can also be directly incident into/upon the respective fluorescent unit 360 without passing through the interspace 19. The plurality of fluorescent units 360, thus, are excited to generate complex energy level transitions and then emit various kinds (e.g., intensity and/or color) of visible light to yield a desired image.

The manufacturing method for the FED 30 is essentially similar to the manufacturing method for the FED 20, except of the formation of the fluorescent layer 36.

The formation of the fluorescent layer 36 can include the steps of: forming a plurality of fluorescent units 360 on the plurality of electron emitters 224, respectively, using the photo-mask as used in the formation of the electron emitters 224. Accordingly, each fluorescent unit 360 is readily aligned with the respective electron emitter 224 without influence of the interspace 19 and the transformation of the anode 14. Alternatively, it could be possible to form a continuous fluorescent layer 36 first and etch such a layer to result in the respective fluorescent units 360.

Figure 4:
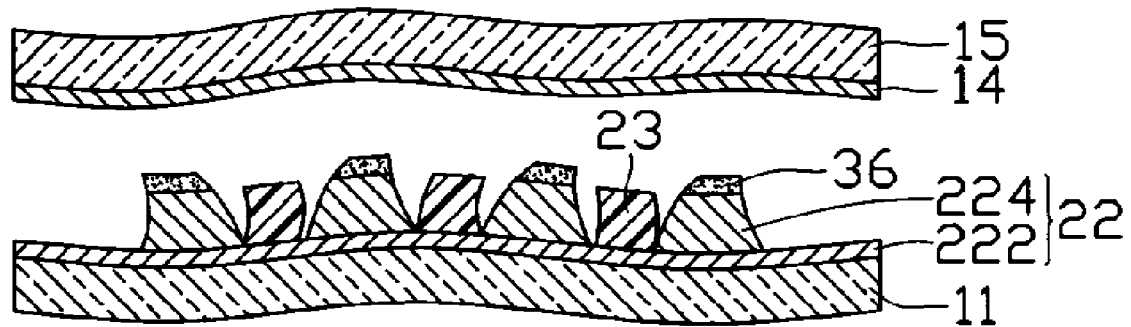
FIG. 4 is similar to FIG. 3, but showing that the FED of FIG. 3 is distorted.
Figure 5:
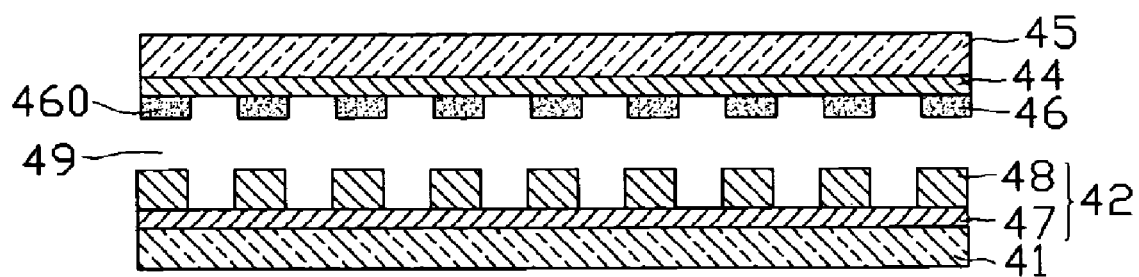
FIG. 5 is a schematic, cross-sectional view of a typical FED.
Figure 6:
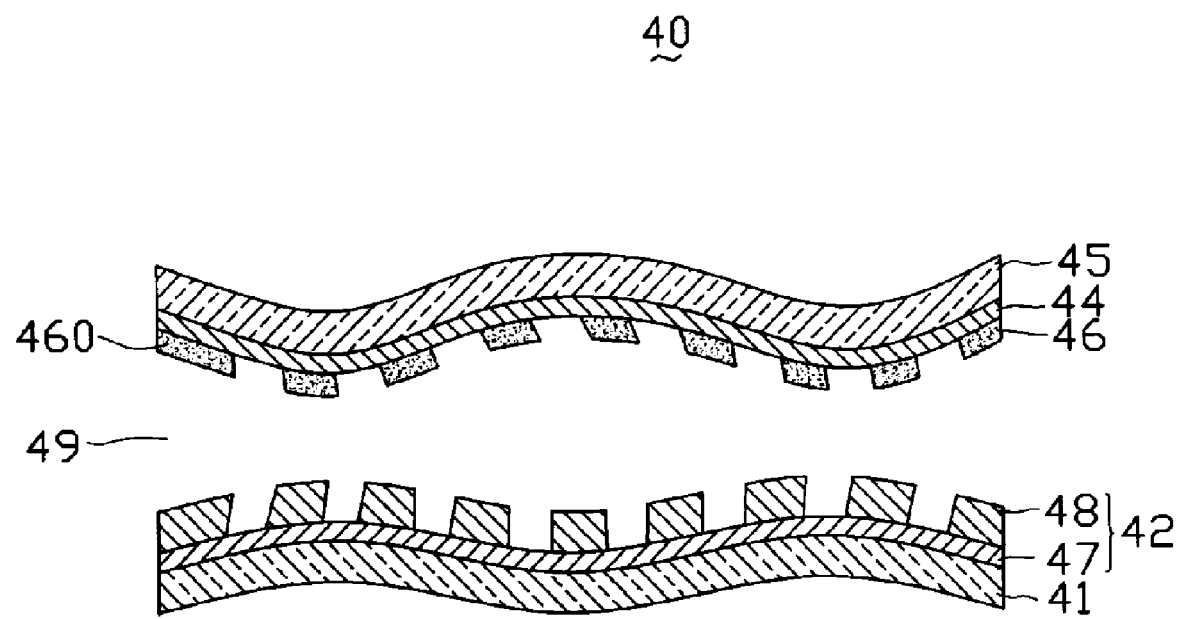
FIG. 6 is similar to FIG. 5, but showing that the FED of FIG. 5 is distorted.

FIG. 4 illustrates the FED 30 distorted or folded. When distorting or folding the FED 30, every component, i.e., the cathode substrate 11, the cathode 32, the anode 14, the anode substrate 15, and the fluorescent layer 36, can generate respective transformations (e.g., in shape and/or relative position). Since each fluorescent unit 360 is formed on the respective electron emitter 224, the fluorescent unit 360 can synchronously transform/move along (i.e., in concert) with the respective electron emitter 224. Accordingly, the distorting or folding of the FED 30 has little influence upon the original alignment of each fluorescent unit 360 with respect to the respective electron emitter 224, thereby helping to better ensure the quality of image. As such, the FED 30 has a relatively stable quality of image and can be subject to unintended or intended flexure/bending, the resulting image quality likely being limited much more by the curvature effects within the anode 14 than due to any potential misalignment between any respective electron emitter 224/fluorescent unit 360 pair. Likewise, the FEDs 10, 20 have the advantages set above.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. A field emission device comprising:
   a transparent anode substrate;
   an anode formed on the anode substrate;
   a cathode substrate;
   a cathode formed on the cathode substrate; the cathode facing toward the anode and being spaced therefrom at a predetermined distance; and
   a fluorescent layer formed on the cathode and facing toward the anode.

2. The field emission device as claimed in claim 1, wherein the cathode substrate is electrically conductive, the cathode comprising at least one electron emitter formed on the cathode substrate, the fluorescent layer being formed on the at least one electron emitter.

3. The field emission device as claimed in claim 2, wherein the at least one electron emitter comprises a plurality of spaced electron emitting units formed on the cathode substrate.

4. The field emission device as claimed in claim 3, wherein the fluorescent layer is a continuous layer formed on the plurality of electron emitting units.

5. The field emission device as claimed in claim 3, wherein the fluorescent layer comprises a plurality of spaced fluorescent units, each fluorescent unit being formed on one respective electron emitting unit.

6. The field emission device as claimed in claim 1, wherein the cathode substrate is non-conductive, the cathode comprising an electrically conductive base and at least one electron emitter formed on the electrically conductive base, the fluorescent layer being formed on the least one electron emitter.

7. The field emission device as claimed in claim 6, wherein the at least one electron emitter comprises a plurality of spaced electron emitting units formed on the electrically conductive base.

8. The field emission device as claimed in claim 7, wherein the fluorescent layer is a continuous layer formed on the plurality of electron emitting units.

9. The field emission device as claimed in claim 7, wherein the fluorescent layer comprises a plurality of spaced fluorescent units, each fluorescent unit being formed on one respective electron emitting unit.

10. The field emission device as claimed in claim 1, wherein at least one of the cathode substrate, the transparent anode substrate, the cathode and the anode are flexible.

11. The field emission device as claimed in claim 1, wherein the electron emitter is made of a material selected from the group consisting of: carbon nanotubes, carbon fibers, graphite, diamond, silicon carbide, silicon, and an emissive metal.

12. A method for manufacturing a field emission device, the method comprising the steps of:
   providing a cathode substrate;
   forming a cathode on the cathode substrate;
   forming a fluorescent layer on the cathode;
   providing a transparent anode substrate;
   forming an anode on the anode substrate, the anode facing toward the fluorescent layer; and
   assembling the anode substrate to the cathode substrate at a predetermined distance therefrom, thereby obtaining the field emission device.

13. The method as claimed in claim 12, wherein the formation of the cathode comprises the step of forming at least one electron emitter on the cathode substrate.

14. The method as claimed in claim 12, wherein the formation of the cathode comprises the step of: forming an electrically conductive base on the cathode substrate; and forming at least one electron emitter on the electrically conductive base.

15. The field emission device as claimed in claim 12, wherein the cathode, anode, and fluorescent layer are formed by a method selected from the group consisting of:
   a chemical vapor deposition method, a sputtering method, a photoresist process, and a screen print process.

* * * * *